United States Patent
Clara

(10) Patent No.: US 10,090,854 B1
(45) Date of Patent: Oct. 2, 2018

(54) DIGITAL-TO-ANALOG CONVERTER AND METHOD FOR CORRECTING GAIN MISMATCH BETWEEN A FIRST SEGMENT AND A SECOND SEGMENT OF A DIGITAL-TO-ANALOG CONVERTER

(71) Applicant: Intel Corporation, Santa Clara, CA (US)

(72) Inventor: Martin Clara, Newton, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/704,152

(22) Filed: Sep. 14, 2017

(51) Int. Cl.
*H03M 1/66* (2006.01)
*H03M 1/68* (2006.01)
(Continued)

(52) U.S. Cl.
CPC .............. *H03M 1/687* (2013.01); *H03M 1/08* (2013.01); *H03M 1/1009* (2013.01); *H03M 1/664* (2013.01); *H03M 1/70* (2013.01)

(58) Field of Classification Search
CPC ...... H03M 1/08; H03M 1/664; H03M 1/1009; H03M 1/70; H03M 1/687; H03M 1/68; H03M 1/10; H03M 1/66; H03M 1/747
(Continued)

(56) References Cited

U.S. PATENT DOCUMENTS 4,583,188 A * 4/1986 Cann .................. G06J 1/00
                                                    341/138
5,703,587 A * 12/1997 Clark .................. H03M 1/68
                                                    341/118
(Continued)

OTHER PUBLICATIONS

Baird, R., & Fiez, T.: "Linearity enhancement of multibit ΔΣ and D/A converters using data weighted averaging", IEEE Transactions on Circuits and Systems II: Analog and Digital Signal Processing (vol. 42, Issue: 12, Dec. 1995), 1057-7130.
(Continued)

*Primary Examiner* — Jean B Jeanglaude
(74) *Attorney, Agent, or Firm* — 2SPL Patentanwälte PartG mbB; Mani Arabi

(57) ABSTRACT

A method for correcting gain mismatch between a first segment and a second segment of a digital-to-analog converter is provided. The first segment generates a first contribution to an analog output signal of the digital-to-analog converter based on a first number of bits of a digital input word for the digital-to-analog converter, wherein the second segment generates a second contribution to the analog output signal based on a second number of bits of the digital input word. The method includes extending a numeric range of a second control word for the second segment by a predefined number of bits, wherein the second control word is indicative of the second number of bits. Further, the method includes multiplying the second control word by a correction value that is based on information about a gain error of the first segment. The method additionally includes digitally filtering the multiplied first control word. After the digital filtering, the method further includes reducing the numeric range of the multiplied second control word by the predefined number of bits to generate a modified second control word for the second segment. Additionally, the method includes supplying the modified second control word as input to the second segment.

25 Claims, 6 Drawing Sheets

(51) Int. Cl.
*H03M 1/08* (2006.01)
*H03M 1/10* (2006.01)
*H03M 1/70* (2006.01)

(58) Field of Classification Search
USPC .................................. 341/144, 138, 118, 143
See application file for complete search history.

(56) References Cited

U.S. PATENT DOCUMENTS

| | | | | |
|---|---|---|---|---|
| 5,977,899 | A * | 11/1999 | Adams | H03M 3/50 |
| | | | | 341/143 |
| 7,183,958 | B2 * | 2/2007 | Quilligan | H03M 1/68 |
| | | | | 341/144 |
| 2007/0024480 | A1 * | 2/2007 | Schwoerer | H03H 11/12 |
| | | | | 341/144 |

OTHER PUBLICATIONS

Carley, L.: "A noise-shaping coder topology for 15+ bit converters", IEEE Journal of Solid-State Circuits (vol. 24, Issue: 2, Apr. 1989), 267-273.

Cong, Y., Geiger, R. L.: "A 1.5-V 14-bit 100-MS/s self-calibrated DAC", IEEE Journal of Solid-State Circuits (vol. 38, Issue: 12, Dec. 2003). 2051-2060.

Groeneveld, D. V., et al: "A self-calibration technique for monolithic high-resolution D/A converters", IEEE Journal of Solid-State Circuits (vol. 24, Issue: 6, Dec. 1989 ), 1517-1522.

Lin, C.-H. et al: "A 10-b, 500-MSample/s CMOS DAC in 0.6 mm2", IEEE Journal of Solid-State Circuits (vol. 33, Issue: 12, Dec. 1998 ), 1948-1958.

Pelgrom, M. et al: "Matching properties of MOS transistor", IEEE Journal of Solid-State Circuits (vol. 24, Issue: 5, Oct. 1989 ), 1433-1439.

Plas, G. V. et al: A 14-bit intrinsic accuracy Q2 random walk CMOS DAC. IEEE Journal of Solid-State Circuits (vol. 34, Issue: 12. Dec. 1999), 1708-1718.

Schonfield, W.., et al: "A 16b 400MS/s DAC with <-80dBc IMD to 300MHz and <-160dBm/Hz noise power spectral density" Solid-State Circuits Conference, 2003. Digest of Technical Papers. ISSCC. 2003 IEEE International, 0193-6530.

\* cited by examiner

DIGITAL-TO-ANALOG CONVERTER AND METHOD FOR CORRECTING GAIN MISMATCH BETWEEN A FIRST SEGMENT AND A SECOND SEGMENT OF A DIGITAL-TO-ANALOG CONVERTER

FIELD

The present disclosure relates to gain mismatch correction between individual segments for segmented Digital-to-Analog Converters (DAC). In particular, examples relate to a DAC and a method for correcting gain mismatch between a first segment and a second segment of a DAC (may be extended to any number of segments).

BACKGROUND

In segmented DACs, the gain (amplitude) mismatch between different segments causes nonlinear distortion, which may be perceived as an increase in noise floor for large narrowband signals, or manifest itself as nonlinear distortion for broadband signals or digitally backed-off signals, which may also be narrowband.

Even with element-wise calibration (i.e. calibration of all DAC cells), a sufficient accuracy at the segment boundaries cannot be achieved easily in practical implementations. Gain mismatch between different DAC segments may, hence, be the dominant source of nonlinearity and/or noise floor, especially for wideband signal synthesis applications.

Hence, there may be a desire for improved gain mismatch correction.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a", "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
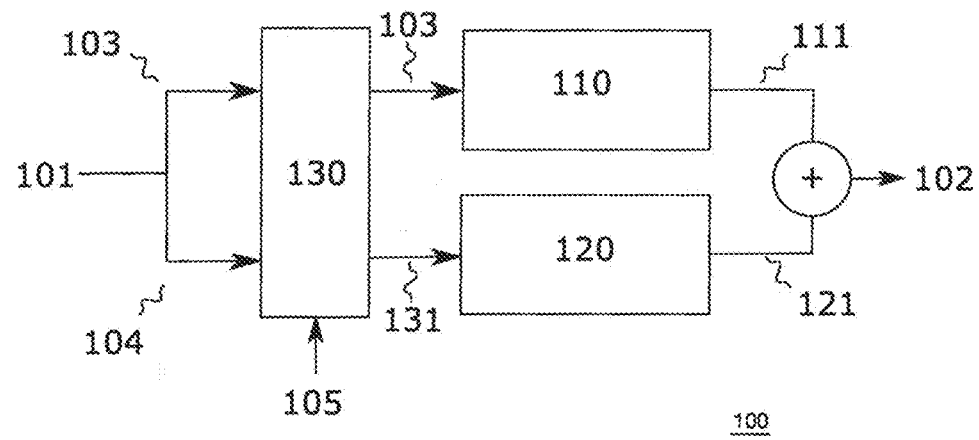
FIGS. 1 and 2 illustrate examples of a DAC.

FIG. 1 illustrates a DAC 100 which provides (generates) an analog output signal 102 based on a digital input word 101. The DAC 100 comprises a first segment 110 that generates a first contribution 111 to the analog output signal 102 based on a first number of bits of the digital input word 101. Further, the DAC 100 comprises a second segment 120 that generates a second contribution 121 to the output signal 102 based on a second number of bits of the digital input word 101. As indicated in FIG. 1, the analog output signal 102 may be generated by combining (e.g. adding) the first contribution 111 and the second contribution 121.

For example, the first segment 110 may comprise a first plurality of DAC cells (not illustrated) each configured to provide a respective weighted analog output, and the second segment 120 may comprise a second plurality of DAC cells (not illustrated) each configured to provide a respective weighted analog output. The weighting of the analog outputs of the first and the second plurality of DAC cells within their respective segments may be identical or different. For example, the analog outputs of one of the first and the second plurality of DAC cells may be unary weighted, and the analog outputs of the other one of the first and the second plurality of DAC cells may be binary weighted. However, any other weighting scheme may be used as well.

If the analog outputs of the DAC cells are binary weighted, the analog output of each DAC cell has a weight of $2^k$ with k=[0, 1, . . . , B−1]. B denotes the number of bits of the digital input word 101 used for controlling the plurality of DAC cells of the respective segment of DAC 100. For example, B may be equal to the first number of bits of the digital input word 101 if the first plurality of DAC cells of the first segment 110 are binary weighted. Accordingly, B may be equal to the second number of bits of the digital input word 101 if the second plurality of DAC cells of the second segment 120 are binary weighted. If the analog outputs of the DAC cells are binary weighted for one of the two segments 110, 120, the segment may comprise B DAC cells to enable digital-to-analog conversion with a resolution of B bits. Binary weighted conversion may allow low complexity since no decoding of the B bit long control word for the segment is required. In other words, each bit of the B bit long control word may directly control the one of the B DAC cells that provides the analog output weight corresponding to the bit weight of the respective bit of the B bit long control word.

If the analog outputs of the DAC cells are unary weighted, the analog outputs of all DAC cells have equal weight. In order to enable digital-to-analog conversion with a resolution of B bits, the respective segment of DAC 100 may comprise $2^B-1$ DAC cells and a (digital) decoder that maps the B bit long control word for the segment to a $2^B-1$ wide control bus. Each digital line of said control bus controls one of the DAC cells.

If the weights of the analog outputs of the first and the second plurality of DAC cells are exact, a linear digital-to-analog conversion characteristic may be achieved. That is, the analog output signal 102 linearly follows a change of the digital input word 101. For example, if the digital input word is changed by a Least Significant Bit (LSB), the output signal 102 linearly changes by an according amount of, e.g., voltage, current or charge (depending on the specific implementation of DAC 100), even if the digital input word (code) 101 'crosses' from the first DAC segment 110 into the second DAC segment 120, or vice versa.

However, due to, e.g., process fluctuations during the manufacturing of DAC 100 or individual DAC cells, the weight of the analog output of one or more of the first and the second plurality of DAC cells may deviate from the nominal weight. For example, one of the DAC cells may effectively provide an analog output which is lower or higher than desired (expected, planed, or designed). That is, the effective signal gain for one of the DAC 100's segments 110, 120 may deviate from a nominal signal gain. For example, the amplitude of the first contribution 111 to the output signal 102 of DAC 100 may be lower than a nominal (desired, expected, planed, designed) signal amplitude, and vice versa. Accordingly, the input-output characteristic of the DAC may be distorted. For example, additional error energy may be present in the output signal 102 of the DAC. The additional error energy may, e.g., be perceived as additional noise (for high-order nonlinear errors), or as harmonic distortions (for low-order nonlinear errors).

In order to compensate for the gain mismatch between the first segment 110 and the second segment 120, DAC 100 further comprises digital processing circuit 130. The digital processing circuit 130 is configured to extend a numeric range of a second control word 104 for the second segment 120 by a predefined number of bits. The second control word 104 is indicative of the second number of bits (e.g. the second control word 104 may be the second number of bits). For example, if the second control word 104 has a length of L bits because the second segment generates the second contribution 121 based on L bits of the digital input word 101, the digital processing circuit 130 may extend the second control word 104 to a length of P bits, wherein P>L.

Further, the digital processing circuit 130 is configured to multiply the second control word by a correction value 105 that is based on information about the gain mismatch between the first segment 110 and the second segment 120. For example, the information about the gain mismatch between the first segment 110 and the second segment 120 may indicate a relative difference between an effective gain of the first segment 110 and a nominal gain of the first segment 110.

The digital processing circuit 130 is configured to digitally filter the multiplied second control word (e.g. using a nonlinear transfer function). After the digital filtering, the digital processing circuit 130 is further configured to reduce the numeric range of the multiplied second control word by the predefined number of bits to generate a modified second control word 131 for the second segment 120.

Further, the digital processing circuit 130 is configured to supply the modified second control word 131 as input to the second segment 120.

Multiplying the second control word 104 by the correction value may allow to scale the second contribution 121 as provided by the second segment 120 to the effective output of the first segment 110, i.e. to the effective first contribution 111 to the output signal 102 of DAC 100. In other words, the digital processing circuit 130 modifies the input to the second segment 120 so that it matches the gain of the first segment 110 after digital-to-analog conversion. Accordingly, the gain mismatch between first segment 110 and the second segment 120 may be compensated for.

The extension of the second control word 104's numeric range provides the required head-room for multiplying the value represented by the second number of bits with the correction value used for scaling the second contribution 121. Since the second segment is physically implemented for an L bit digital-to-analog conversion, the multiplied second control is reduced again to L physical bits. The digital filtering further enables to preserve spectral signal properties (e.g. within a specified frequency range). For example, digitally filtering the multiplied second control word may comprise (low-pass) noise shaping of $1^{st}$ or higher order.

In order to account for the delay introduced by the above described gain-correction processing for the second segment 120, the digital processing circuit 130 may delay a first control word 103 for the first segment 110 that is indicative of the first number of bits of the digital input word 101 (e.g. the first control word 103 may be the first number of bits). For example, the digital processing circuit 130 may be configured to delay the first control word 103 by a first delay time. The first delay time may be based on a processing time required by the digital processing circuit 130 for at least one of extending the numeric range of the second control word 104 for the second segment 120, multiplying the second control word 104 by the correction value, digitally filtering the multiplied second control word, and reducing the numeric range of the multiplied second control word.

Although not illustrated in FIG. 1, DAC 100 may comprise one or more additional segments for digital-to-analog conversion. The one or more additional segments may generate further contributions to analog output signal 102 of DAC 100 based further numbers of bits of the digital input word 101. For example, DAC 100 may further comprise a third segment generating a third contribution to the analog output signal 102 based on a third number of bits of the digital input word 101, etc.

The quality of the above described inter-segment gain error correction may rely on the accuracy of the estimation of the actual inter-segment gain error, i.e. on the accuracy of the information about the gain mismatch between the first segment 110 and the second segment 120.

The gain mismatch between the first segment 110 and the second segment 120 may be determined in many different ways. For illustrative purposes, three different ways for determining the gain mismatch between the first segment 110 and the second segment 120 are described in the following.

For example, the analog weight of at least one DAC cell of the first segment 110 and at least one DAC cell of the second segment 120 may be measured during manufacture of DAC 100 at wafer level test or at packaged chip test (to include stress gradients incurred by packaging). More than one element from each relevant segment 110, 120 may be measured and the gain error (mismatch) may be calculated from their average—at the expense of a longer test time. This may be extended up to the measurement of the full static converter characteristic.

Alternatively, on-board or on-chip circuitry may measure the analog weight of at least one (e.g. several) DAC cell(s) from each relevant segment 110, 120 of the DAC at system power-on or during dedicated calibration time-slots. The measurement may be performed directly at the output of the DAC 100 or at some convenient intermediate node (not illustrated in FIG. 1).

That is, the information about the gain mismatch between the first segment 110 and the second segment 120 may be based on a measured weight of the analog output of at least one DAC cell of the first segment 110 and the measured weight of the analog output of at least one DAC cell of the second segment 120.

Further alternative, background measurements during regular operation of DAC 100 may be used. For example, if an observation receiver external of DAC 100 that exhibits sufficient accuracy (dynamic range) is available in a system employing DAC 100, it may be used to extract information about the quality of the digital-to-analog conversion by DAC 100. Since inter-segment gain errors produce a distinct error-pattern in the output signal 102 of DAC 100, background measurements on output signal 102 (e.g. after filtering the output signal 102) may allow to determine information about the gain mismatch between the first segment 110 and the second segment 120. The required correction factor may furthermore be determined using an adaptive algorithm that minimizes the observed error energy in the output signal 102.

That is, the information about the gain mismatch between the first segment 110 and the second segment 120 may be based on an observed error in the analog output signal 102 of DAC 100 while the analog output signal 102 comprises user data.

While some basic principles of gain mismatch correcting according to the proposed technique were described above in connection with FIG. 1, more detailed examples of DACs according to the proposed technique are described in the following.

Figure 2:
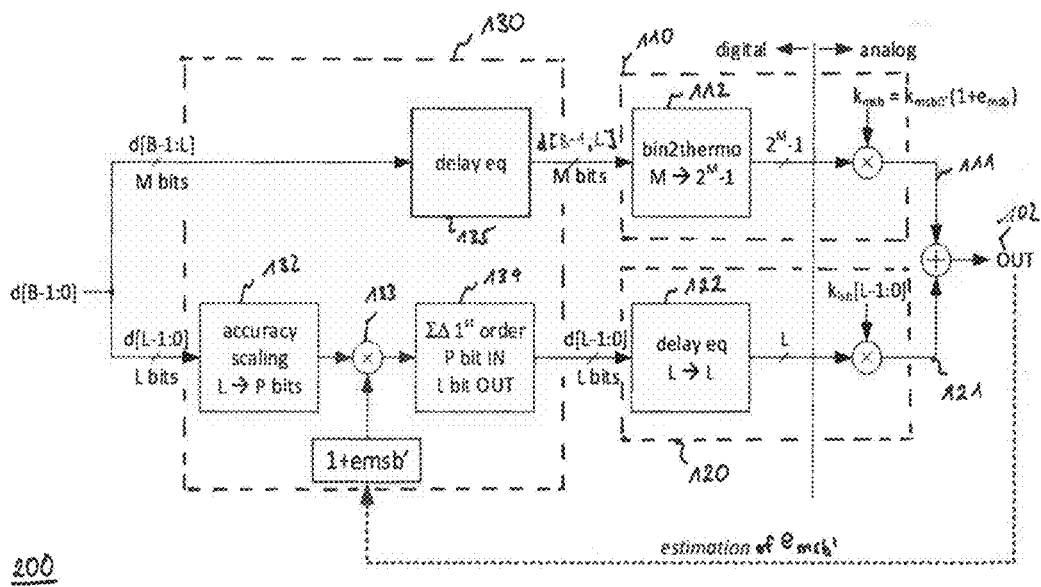

FIG. 2 illustrates a DAC 200 comprising a first segment 110 and a second segment 120 for converting the B bits of digital input word d[B−1:0]. The first segment 110 generates a first contribution 111 to the analog output signal 102 of DAC 200 based on the M Most Significant Bits (MSB) of digital input word d[B−1:0]. The second segment 120 generates a second contribution 121 to the analog output signal 102 of DAC 200 based on the L LSBs of digital input word d[B−1:0].

Accordingly, the digital input word d[B−1:0] is split up into a first control word d[B−1:L] for the first segment 110 that is indicative of the M MSBs of digital input word d[B−1:0], and a second control word d[L−1:0] for the second segment 120 that is indicative of the L LSBs of digital input word d[B−1:0].

In the example of FIG. 2, the first segment 110 is a unary segment, i.e. the analog outputs of the $2^M-1$ DAC cells of first segment 110 have the same weight. Accordingly, the first segment 110 comprises a digital decoder 112 for mapping the M MSBs to $2^M-1$ control signals for the $2^M-1$ DAC cells. The second segment 120 is binary coded, i.e. the analog outputs of the L DAC cells of the second segment 120 have weights $2^{k_{lsb}}$ with $k_{lsb}=[L-1:0]$. Accordingly, the second segment 120 does not require a decoder. In order to compensate for the latency of digital decoder 112, the second segment 120 comprises a delay circuit 122. It is to be noted that weightings used for the first and the second segments 110, 120 are exemplary. Alternatively, the first segment 110 may be binary weighted or the second segment 120 may be unary weighted. In some examples, also other weighting schemes may be used. For example, if the second segment 120 was unary weighted, delay circuit 122 may be replaced by an appropriate digital decoder.

In the example of FIG. 2, it is assumed that the effective gain $k_{msb}$ of the first segment 110 differs from its nominal gain $k_{msb0}$. The relative difference between the effective gain $k_{msb}$ and the nominal gain $k_{msb0}$ may be expressed by means of (real valued) factor $e_{msb}$ ($e_{msb}$ may be much smaller than 1, e.g., less than 3%, 5%, 7%, 8%, or 10%). Accordingly, the effective gain $k_{msb}$ of the first segment 110 may be described as $$k_{msb}=k_{msb0}(1+e_{msb}) \quad (1).$$

Further, it is assumed that the weights of the analog outputs of the DAC cells of the second segment 120 are ideal. That is, it is assumed that the effective gain of the second segment 120 is equal to its nominal gain.

The factor $e_{msb}$ is initially unknown. However, it may be determined (estimated) as described above in connection with DAC 100. The estimate $e_{msb'}$, i.e. information about the gain mismatch between the first segment 110 and the second segment 120, is provided (in digital form) to digital processing circuit 130.

The digital processing circuit 130 comprises first scaling circuitry 132 for extending a numeric range of the second control word d[L−1:0] by a predefined number of bits. As indicated in FIG. 2, the numeric range of the second control word d[L−1:0] may be extended from L bits to P bits, wherein P>L.

Further, the digital processing circuit 130 comprises multiplication circuitry 133 for subsequently multiplying the second control word by the correction value $1+e_{msb'}$. The digital processing circuit 130 generates the correction value based on the received estimate $e_{msb'}$, i.e. information about the gain mismatch between the first segment 110 and the second segment 120. Due to the multiplication of the second control word by the correction value $1+e_{msb'}$, the digital input for the second segment 120 now matches the gain of the first segment 110 after the digital-to-analog conversion, i.e. after processing the first control word d[B−1:L] with the DAC cells of the first segment 110 that are subject to the inter-segment gain error.

Since the second segment 120 is physically designed for L bit digital-to-analog conversion, the data after multiplication is again reduced to L physical bits. In the example of FIG. 2, the digital processing circuit 130 comprises digital noise shaping circuitry 134 implemented as digital ΔΣ modulator. The digital noise shaping circuitry 134 digitally filters the multiplied second control word and further reduces the numeric range of the multiplied second control word of P bits length by the predefined number of bits to generate a modified second control word of L bits length for the second segment 120. The digital processing circuit 130 supplies the modified second control word as input to the second segment 120.

In the example of FIG. 2, the digital noise shaping circuitry 134 performs $1^{st}$ order low-pass noise shaping. However, it is to be noted that any (nonlinear) digital filter that preservers the spectral signal properties within a specified frequency range (in-band frequency range) may be used. In some examples, higher order noise shaping (e.g. for potentially large inter-segment gain errors), band-pass or high-pass noise shaping (e.g. for different in-band frequency ranges) may be used.

The digital pre-processing of the second control word in order to provide the modified second control word may allow to eliminate the inter-segment gain error.

In order to compensate for the digital pre-processing of the second control word, the digital processing circuit 130 further comprises delay circuitry 135 for delaying the first control word d[B−1:L] by a first delay time. The first delay time is based on the processing time required by the digital processing circuit 130 for extending the numeric range of the second control word, multiplying the second control word by the correction value, digitally filtering the multiplied second control word, and reducing the numeric range of the multiplied second control word. The latency of the gain-correction processing may be exactly known since the processing is done in the digital domain. Accordingly, the delay circuitry 135 may enable exact alignment in the time domain of both contributions 111, 121 to the analog output signal 102 of DAC 200.

In some examples, the delay circuit 122 may be omitted if the first delay time is adjusted accordingly. That is, the first delay time then represents the difference between the processing times in the upper branch and the lower branch of DAC 200.

Figure 3:
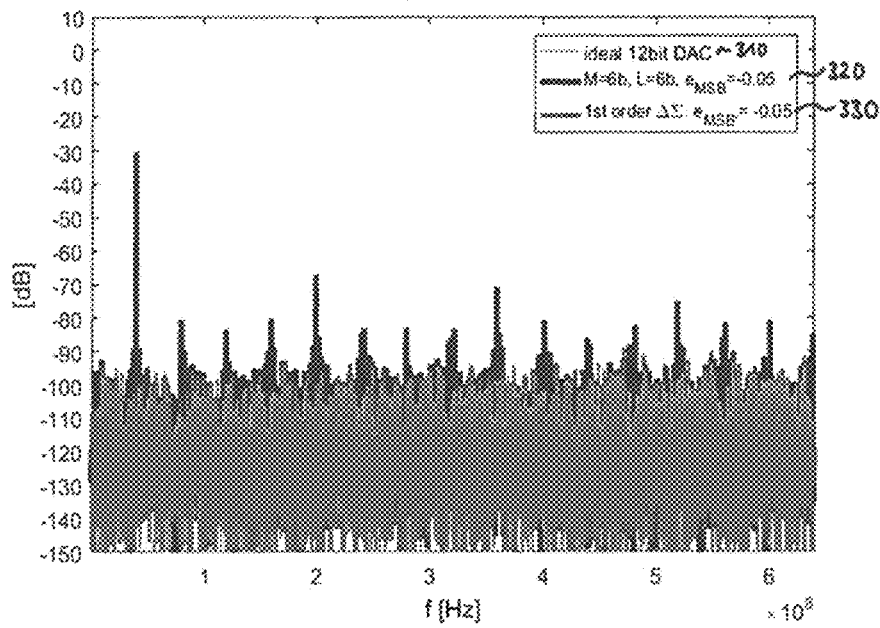
FIGS. 3 and 4 illustrate exemplary spectra of DAC output signals.

FIG. 3 illustrates a first comparison of exemplary spectra of DAC output signals in heavy digital back-off. In FIG. 3, a DAC exhibiting two segments and a resolution of 12 bits is assumed. Both segments generate contributions to the DAC's analog output signal based on 6 bits of the digital input word.

The first spectrum 310 illustrates the resulting spectrum for a −30 deciBels relative to Full Scale (dBFS) sine wave using the ideal 12 bit DAC, i.e. the DAC does not exhibit any gain errors. The second spectrum 320 illustrates the resulting spectrum for a gain error of $e_{msb}=-0.05$ in the segment that processes the MSBs. For the second spectrum 320 it is assumed that no inter-segment gain error correction according to the proposed technique is used. The third spectrum 330 further illustrates the resulting spectrum if inter-segment gain error correction according to the proposed technique is used. In particular, it is assumed for the third spectrum 330 that $1^{st}$ order noise shaping by means of a digital ΔΣ modulator is used (as illustrated in FIG. 2).

It is evident from FIG. 3 that energy is concentrated at harmonics of the wanted sine signal at about 40 MHz without inter-segment gain error correction error. Using inter-segment gain error correction according to the proposed technique, the concentration of error energy into low-order harmonics is prevented. That is, the spectra 310 and 330 are almost identical up to frequencies of 300 MHz. Compared to spectrum 320, the noise level of spectrum 330 is significantly reduced. Merely at higher frequencies, the noise shaping generates some out-of-band excess quantization noise compared to ideal spectrum 310. However, also at higher frequencies the concentration of error energy at harmonics of the wanted sine signal is prevented by the inter-segment gain error correction according to the proposed technique.

In the example of FIG. 3, it is assumed that the gain mismatch between the DAC segments is exactly known. That is, it is assumed that the correction value $1+e_{msb'}$ used in DAC 200 is equal to the deviation of the first segment's effective gain to its nominal gain (which is $1+e_{msb}$).

Figure 4:
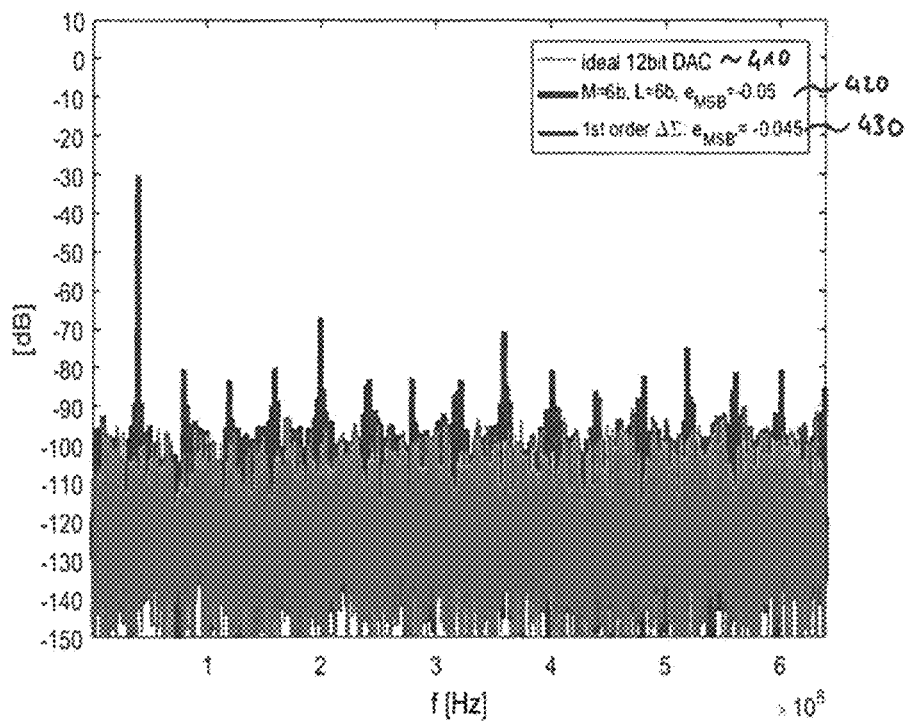

In FIG. 4, an estimation error of 10% for the gain mismatch between the DAC segments is assumed, i.e. $e_{msb'}=-0.045$ instead of −0.05. The third spectrum 430 illustrates the resulting spectrum of the DAC's output signal. As a comparison a first spectrum 410 and a second spectrum 420 are further illustrated in FIG. 4. First spectrum 410 corresponds to first spectrum 310 illustrated in FIG. 3, and second spectrum 420 corresponds to second spectrum 320 illustrated in FIG. 3.

The third spectrum 430 is in general similar to the third spectrum 330 assuming perfect estimation of the gain mismatch. Merely a rise of the fifth harmonic to −89 dBFS, i.e. −59 dB carrier (dBc), is visible. That is, even for a 10% estimation error of the gain mismatch, the concentration of error energy at harmonics of the wanted sine signal may be prevented, and a significant decrease of the noise level may be achieved compared to spectrum 420.

Figure 5:
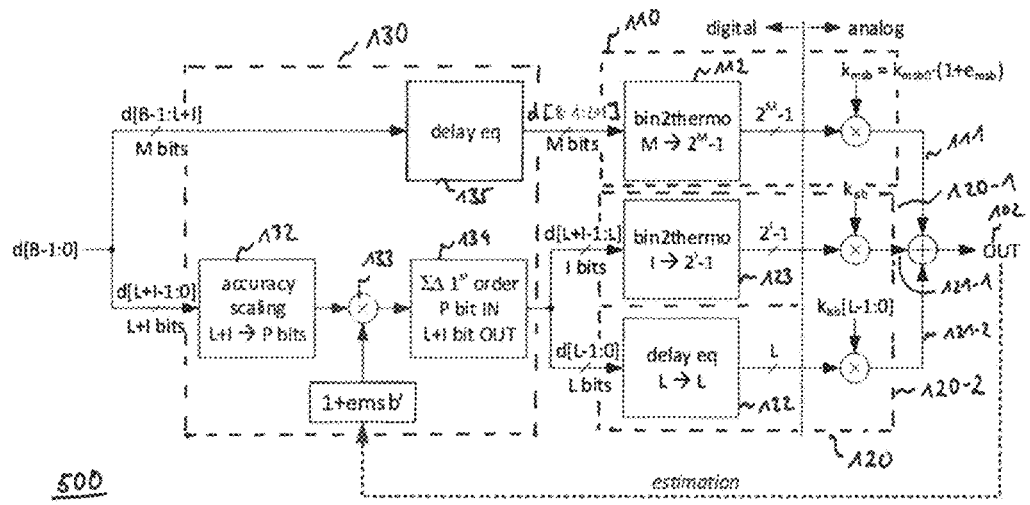
FIGS. 5 to 9 illustrates further examples of a DAC.

FIG. 5 further illustrates another DAC 500 comprising more than two segments for generating contributions to the analog output signal of the DAC. In particular, DAC 500 comprises three segments for generating contributions to the analog output signal of the DAC. However, if there is no gain mismatch between two of these segments, these segments may be treated as a single segment. In other words, they may be understood as sub-segments of a single segment of the DAC.

DAC 500 comprises the first segment 110 and the second segment 120 for converting the B bits of digital input word d[B−1:0]. The first segment 110 generates a first contribution 111 to the analog output signal 102 of DAC 200 based on the M Most Significant Bits (MSB) of digital input word d[B−1:0]. The second segment 120 generates a second contribution 121 to the analog output signal 102 of DAC 200 based on the L+I LSBs of digital input word d[B−1:0].

Accordingly, the digital input word d[B−1:0] is split up into a first control word d[B−1:L+I] for the first segment 110 that is indicative of the M MSBs of digital input word d[B−1:0], and a second control word d[L+I−1:0] for the second segment 120 that is indicative of the L+I LSBs of digital input word d[B−1:0].

The first segment 110 is implemented like in DAC 200 described above in connection with FIG. 2. Again, the first segment 110 is assumed to exhibit an effective gain $k_{msb}$ that is different from its nominal gain $k_{msb0}$. Further, it is assumed that the weights of the analog outputs of the DAC cells of the second segment 120 are ideal. That is, it is assumed that the effective gain of the second segment 120 is equal to its nominal gain.

Also the digital processing circuit 130 is implemented like in DAC 200 described above in connection with FIG. 2. That is, the digital processing circuit 130 generates a modified second control word of L+I bits length for the second segment 120 based on the second control word d[L+I−1:0] as described above in connection with FIG. 2.

As said above, the second segment 120 comprises two sub-segments which do not exhibit a gain mismatch between each other. In particular, the second segment 120 comprises a first sub-segment 120-1 configured to generate a first part 121-1 of the second contribution to the analog output signal 102 of DAC 500 based on a first part of the modified second control word, and a second sub-segment 120-2 generating a second part 122-1 of the second contribution to the analog output signal 102 based on a second part of the modified second control word.

As illustrated in FIG. 2, the modified second control word of length L+I bits may be split into a first part d[L+I−1:L] of length I, so that the first sub-segment 120-1 generates the first part 121-1 of the second contribution to the analog output signal 102 based on I bits of the digital input word d[B−1:0], and a second part d[L−1:0] of length L, so that the second sub-segment 120-2 generates the second part 121-2 of the second contribution to the analog output signal 102 based on the remaining L bits of the digital input word d[B−1:0].

In the example of FIG. 5, the first sub-segment 120-1 is illustrated as unary weighted (including digital decoder 123), whereas the second sub-segment 120-2 is illustrated as binary weighted (including delay circuit 122). Again, it is to be noted that the weight distribution within the (sub-) segments (i.e. unary, binary or anything else) is not relevant for the inter-segment gain error correction according to the proposed technique. In some examples, both sub-segments 120-1 and 120-2 may, e.g., be implemented with a unary or a binary weighting. As described above, also the weighting of the first segment 110 may be changed to binary or any other weighting.

With the examples described in FIGS. 2 and 5, inter-segment gain errors with $e_{msb}<0$ may be corrected (i.e. the effective gain of the first segment is smaller than its nominal gain). In the following, two approaches for correcting inter-segment gain errors with $e_{msb}>0$ (i.e. the effective gain of the first segment is larger than its nominal gain) are described in connection with FIGS. 6 and 7.

Figure 6:
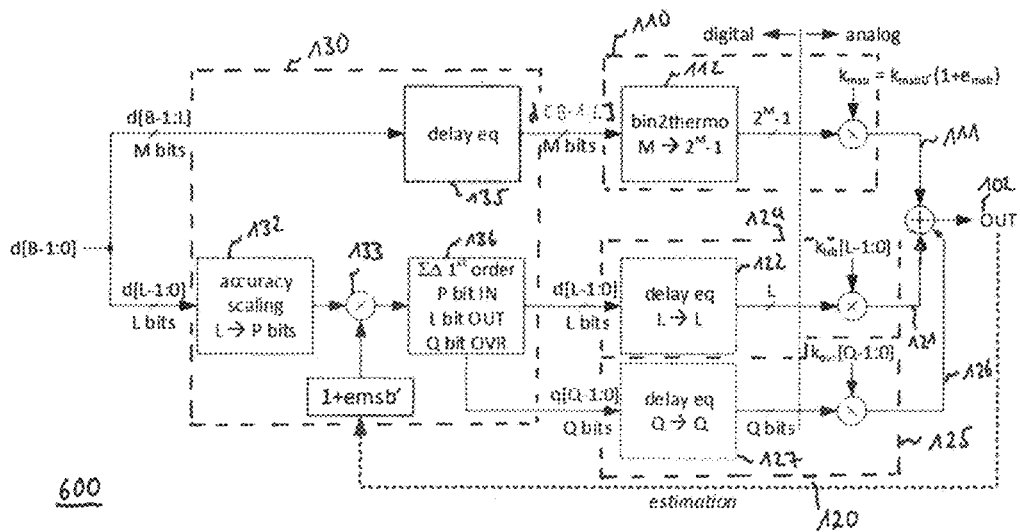

The first approach is illustrated in FIG. 6 and uses additional ADC cells in the second segment of DAC 600.

DAC 600 comprises the first segment 110 and the second segment 120 for converting the B bits of digital input word d[B−1:0]. The first segment 110 generates a first contribution 111 to the analog output signal 102 of DAC 200 based on the M Most Significant Bits (MSB) of digital input word d[B−1:0]. The second segment 120 generates a second contribution 121 to the analog output signal 102 of DAC 200 based on the L LSBs of digital input word d[B−1:0].

Accordingly, the digital input word d[B−1:0] is split up into a first control word d[B−1:L] for the first segment 110 that is indicative of the M MSBs of digital input word d[B−1:0], and a second control word d[L−1:0] for the second segment 120 that is indicative of the L LSBs of digital input word d[B−1:0].

The first segment 110 is implemented like in DAC 200 described above in connection with FIG. 2. Again, the first segment 110 is assumed to exhibit an effective gain $k_{msb}$ that is different from its nominal gain $k_{msb0}$. In particular, it is assumed that the effective gain $k_{msb}$ that is larger than the nominal gain $k_{msb0}$.

The second segment 120 comprises a plurality of DAC cells 124 configured to generate the second contribution 121 to the analog output signal 102 of DAC 600. It is assumed that the weights of the analog outputs of the DAC cells of the second segment 120 are ideal. That is, it is assumed that the effective gain of the second segment 120 is equal to its nominal gain.

The digital processing circuit 130 is implemented similarly to DAC 200 described above in connection with FIG. 2. The digital processing circuit 130 is implemented similar in so far as it is configured to generate a modified second control word of L bits length for the plurality of DAC cells 124 of the second segment 120 based on the second control word d[L−1:0] as described above in connection with FIG. 2. Accordingly, the plurality of DAC cells 124 generate the second contribution 121 to the analog output signal 102 based on the modified second control word.

In the example of FIG. 6, the second segment 120 comprises at least one further DAC cell 125. For example, the at least one further DAC cell 125 may be a dummy cell, which is physically present in the second segment 120 for layout symmetry, but conventionally not used for signal processing. Alternatively, the at least one further DAC cell 125 may be purposely added to the second segment 120.

Compared to the digital processing circuit described in connection with FIG. 2, digital processing circuit 130 illustrated in FIG. 6 is further configured to generate an additional control word q[Q−1:0] of Q bits length for the second segment based on the multiplied second control word, and to supply the additional control word q[Q−1:0] as input to the second segment 120.

The at least one further DAC cell 125 generates an additional contribution 126 to the analog output signal 102 of DAC 700 based on the additional control word q[Q−1:0].

Compared to the second segment described in connection with FIG. 2, second segment 120 illustrated in FIG. 6 exhibits an extended range. That is, its local full-scale is larger than the full-scale of the second segment described in connection with FIG. 2 due to the at least one further DAC cell 125. Accordingly, the second contribution 121 and the additional contribution 126 to the output signal 102 of DAC 600 may account for, i.e. match, the too big effective gain (amplitude) of the first contribution 111 provided by the first segment 110.

In other words, the second segment 120 provides a positive analog overrange by means of the at least one further DAC cell 125. Accordingly, DAC 600 may allow to further compensate gain errors $e_{msb}>0$. Assuming a normalization of the weights of the analog output of the plurality of DAC cells 124 to the LSB size (LSB=1), the L-bit second segment 120 has a maximum analog output of $2^L-1$ LSB-weights in a standard segmented converter, while the analog output of each cell in the M-bit first segment 110 has a weight of $2^L$ LSB-weights. Accordingly, the ideal analog full-scale of the first segment 110 and the full DAC 700 is $2^L \cdot (2^M-1)$ and $2^{M+L}-1=2^B-1$, respectively. Ideally, the sum of the analog outputs of the DAC cells 124 of the second segment 120+1 LSB weight is equal to the analog weight of 1 MSB DAC cell in the first segment 110. Taking into account the inter-segment gain error $e_{msb}$, the weight of the analog output of a single MSB DAC cell in the first segment 110 becomes $(1+e_{msb}) \cdot 2^L$. Hence, for $e_{msb}>0$, the sum of the analog weights in the second segment 120 needs to be larger than $2^L-1$ LSB-weights. This overrange is accomplished by using at least one further DAC cell 125 in the second segment 125. Accordingly the sum of the weights of all DAC cells in the second segment 120 is larger than $(1+\max(e_{msb})) \cdot (2^L-1)>(2^L-1)$, also including all possible random and systematic variations. For a small expected $\max(e_{msb})$, a very limited number of additional DAC cells (e.g. with normalized analog weight 1) may be added to the second segment 120 in order to provide a small analog overrange. If a larger analog overrange is required, extra cells with bigger analog weight (e.g. binary-scaled) may be added to the second segment 120. As described above, the at least one further DAC cell 125 may be a dummy cell, which is physically present in the second segment 120 for layout symmetry, but conventionally not used for signal processing. Further, the data decoder for the second converter segment 120 may be modified to take into account the extended data range of the second segment 120: 0 . . . $2^L-1+Q$, with Q being the number of extra digital codes available in the second converter segment 120.

In the example of FIG. 6, the second segment 120 provides an analog overrange of sum($k_{ovr}$). For example, if digital noise shaping circuitry 136 of digital processing circuit 130 provides 6 bit noise shaping with a 3 LSB overrange, the output range may be extended from the original range 0 ... 63 to 0 ... 66, with 63 being the nominal full-scale for $e_{msb}$=0. This may be implemented with Q=2 bits and 2 extra, binary-scaled DAC cells with analog weights 1 and 2. Since $k_{msb}$=64, this may allow for the correction of a maximum first segment 110 gain-error of $e_{msb}$≤3/64=+4.7%.

Figure 7:
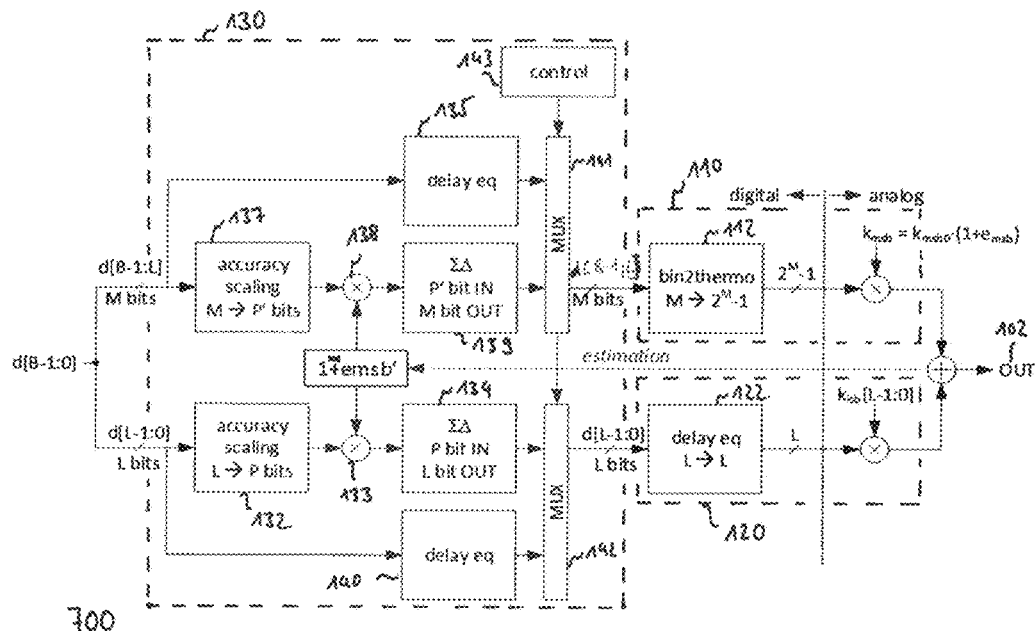

An alternative approach is illustrated in FIG. 7 by means of DAC 700. DAC 700 comprises the first segment 110 and the second segment 120 for converting the B bits of digital input word d[B−1:0]. The first segment 110 generates a first contribution 111 to the analog output signal 102 of DAC 700 based on the M MSBs of digital input word d[B−1:0]. The second segment 120 generates a second contribution 121 to the analog output signal 102 of DAC 200 based on the L LSBs of digital input word d[B−1:0].

Accordingly, the digital input word d[B−1:0] is split up into a first control word d[B−1:L] for the first segment 110 that is indicative of the M MSBs of digital input word d[B−1:0], and a second control word d[L−1:0] for the second segment 120 that is indicative of the L LSBs of digital input word d[B−1:0].

The first segment 110 as well as the second segment 120 are implemented like in DAC 200 described above in connection with FIG. 2. Again, the first segment 110 is assumed to exhibit an effective gain $k_{msb}$ that is different from its nominal gain $k_{msb0}$. In particular, it is assumed that the effective gain $k_{msb}$ that is larger than the nominal gain $k_{msb0}$.

As described above, a negative inter-segment gain error (i.e. $e_{msb}$<0) may be compensated (without the addition of additional DAC cells to the second segment of the DAC) by making the analog output of the second segment, i.e. the second contribution, digitally smaller without changing the physical resolution L of the second segment. In DAC 700, a positive inter-segment gain error (i.e. $e_{msb}$>0) is compensated in the same way by scaling the analog output of the first segment, i.e. the first contribution, in the digital domain. That is, inter-segment gain error compensation may again be achieved by a purely digital add-on to a standard segmented DAC.

A negative inter-segment gain error ($e_{msb}$<0) is again compensated for by digitally scaling (with a correction value smaller than 1) the input to the second segment, while a positive inter-segment gain error ($e_{msb}$>0) is eliminated by scaling (with a correction value smaller than 1) the digital input of the first segment. In both cases the (in-band) analog output of the corrected DAC segment is, hence, slightly smaller (by a factor: 1−|$e_{msb}$|) than its nominal analog weight.

The digital processing circuit 130, hence, comprises the first scaling circuitry 132 and the digital noise shaping circuitry 134 (e.g. implemented as digital ΔΣ modulator) in order to generate the modified second control for the second segment 120 based on the second control word d[L−1:0].

Further, the digital processing circuit 130 comprises second scaling circuitry 137 for extending a numeric range of the first control word d[B−1:L] by a second predefined number of bits. As indicated in FIG. 7, the numeric range of the first control word d[B−1:L] may be extended from M bits to P' bits, wherein P'>M.

The digital processing circuit 130 additionally comprises second multiplication circuitry 138 for subsequently multiplying the second control word by second correction value 1−$e_{msb}$. The digital processing circuit 130 generates the correction value based on the received estimate $e_{msb'}$, i.e. information about the gain mismatch between the first segment 110 and the second segment 120. Due to the multiplication of the first control word by second correction value 1−$e_{msb'}$, the digital input for the first segment 110 now matches the gain of the first segment 110 after the digital-to-analog conversion, i.e. after processing the first control word d[B−1:L] with the DAC cells of the first segment 110 that are subject to the inter-segment gain error.

Since the first segment 110 is physically designed for M bit digital-to-analog conversion, the data after multiplication is again reduced to M physical bits. In the example of FIG. 7, the digital processing circuit 130 comprises second digital noise shaping circuitry 139 implemented as digital ΔΣ modulator. The digital noise shaping circuitry 139 digitally filters the multiplied second control word and further reduces the numeric range of the multiplied second control word of P' bits length by the second predefined number of bits to generate a modified first control word of M bits length for the first segment 110.

In the example of FIG. 7, the second digital noise shaping circuitry 134 may perform noise shaping of $1^{st}$ or higher order. However, it is to be noted that any (nonlinear) digital filter that preservers the spectral signal properties within a specified frequency range (in-band frequency range) may be used.

The supply of control words to the first and the second segments 110, 120 is regulated by first multiplexing circuitry 141 and second multiplexing circuitry 142 of the digital processing circuit 130. Digital control circuitry 143 is used to discriminate between the two possible cases and to activate the correct digital multiplexer (depending on the value of $e_{msb'}$).

If an effective gain of the first segment 100 is smaller than its nominal gain (i.e. $e_{msb}$<0), the digital processing circuit 130 is configured to supply the modified second control word as input to the second segment 120 by means of second multiplexing circuitry 142. Further, digital processing circuit 130 delays the first control word d[B−1:L] by a first delay time using delay circuitry 135 in order to compensate for the digital pre-processing of the second control word. The delayed first control word d[B−1:L] is supplied as input to the first segment 110 by means of first multiplexing circuitry 141.

If the effective gain of the first segment is larger than its nominal gain (i.e. $e_{msb}$>0), the digital processing circuit 130 is configured to supply the modified first control word as input to the first segment 110 by means of first multiplexing circuitry 141. Further, digital processing circuit 130 delays the second control word d[L−1:0] by a second delay time using delay circuitry 140 in order to compensate for the digital pre-processing of the first control word. Similarly to the first delay time, the second delay time is based on the processing time required by the digital processing circuit 130 for at least one of extending the numeric range of the first control word for the first segment, multiplying the first control word by the correction value, digitally filtering the multiplied first control word, and reducing the numeric range of the multiplied first control word. The delayed second control word d[L−1:0] is supplied as input to the first segment 110 by means of second multiplexing circuitry 142.

An advantage of DAC 700 may be that no (analog) architectural change is required. That is, no addition of extra overrange DAC cells and no change to the data decoders for the DAC segments may be required since the physical number of DAC cells and their associated digital data range does not change. Such an inter-segment gain error correction for positive and negative error may, hence, be added as a purely digital preprocessing to an existing DAC.

Figure 8:
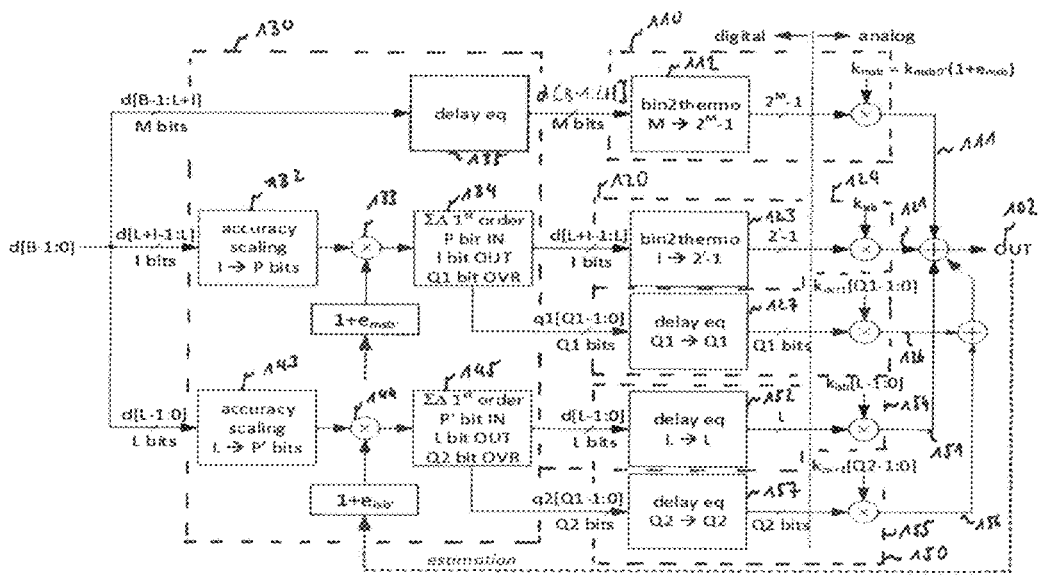

The above described digital correction of inter-segment gain errors may be extended to an arbitrary number of segments. In practice not more than three segments are commonly used for DACs—usually with two segments being thermometer-coded using equal sized DA cells (i.e. unary arrays), and one segment being binary-scaled. FIG. 8 illustrates such a DAC 800 with three segments.

The first segment 110 generates a first contribution 111 to the analog output signal 102 of DAC 800 based on the M MSBs of digital input word d[B−1:0]. The second segment 120 generates a second contribution 121 to the analog output signal 102 of DAC 200 based on I Intermediate Significant Bits (ISB) of digital input word d[B−1:0]. The third segment 150 generates a third contribution 151 to the analog output signal 102 of DAC 700 based on the L LSBs of digital input word d[B−1:0]. That is, third segment 150 generates a third contribution to the analog output signal of DAC 800 based on a third number of bits of the digital input word d[B−1:0].

Accordingly, the digital input word d[B−1:0] is split up into a first control word d[B−1:L+I] for the first segment 110 that is indicative of the M MSBs of digital input word d[B−1:0], a second control word d[L+I−1:L] for the second segment 120 that is indicative of the I ISBs of digital input word d[B−1:0], and a third control word d[L−1:0] for the third segment 150 that is indicative of the L LSBs of digital input word d[B−1:0].

The first segment 110 as well as the second segment 120 are implemented like in DAC 600 described above in connection with FIG. 6 (only the number of processed bits is changed from L to I for the second segment 120). Again, the first segment 110 is assumed to exhibit an effective gain $k_{msb}$ that is different from its nominal gain $k_{msb0}$.

The third segment 150 is implemented like the second segment 120. That is, the third segment 150 comprises a plurality of DAC cells 154 configured to generate the third contribution 151 to the analog output signal 102 of DAC 800.

Also the control of the third segment 150 by digital processing circuit 130 is implemented like for the second segment 120. That is, the digital processing circuit 130 comprises second scaling circuitry 143 for extending a numeric range of the third control word d[L−1:0] by a third predefined number of bits. As indicated in FIG. 8, the numeric range of the third control word d[L−1:0] may be extended from L bits to P' bits, wherein P'>L.

The digital processing circuit 130 additionally comprises second multiplication circuitry 144 for subsequently multiplying the second control word by second correction value $1+e_{isb'}$. The digital processing circuit 130 generates the correction value based on the received estimate $e_{isb'}$, i.e. information about the gain mismatch between the second segment 120 and the third segment 150. Due to the multiplication of the third control word by second correction value $1+e_{isb'}$, the digital input for the third segment 150 now matches the gain of the second segment 120 after the digital-to-analog conversion.

Since the third segment 150 is physically designed for L bit digital-to-analog conversion, the data after multiplication is again reduced to L physical bits. In the example of FIG. 8, the digital processing circuit 130 comprises second digital noise shaping circuitry 145 implemented as digital ΔΣ modulator. The digital noise shaping circuitry 145 digitally filters the multiplied third control word and further reduces the numeric range of the multiplied third control word of P' bits length by the third predefined number of bits to generate a modified third control word of L bits length for the third segment 110.

In the example of FIG. 8, the second digital noise shaping circuitry 145 may perform noise shaping of $1^{st}$ or higher order. However, it is to be noted that any (nonlinear) digital filter that preserves the spectral signal properties within a specified frequency range (in-band frequency range) may be used.

The digital processing circuit 130 supplies the modified third control word as input to the third segment 150 so that the plurality of DAC cells 154 generate the third contribution 151 to the analog output signal 102 based on the modified third control word.

Like the second segment 120, the third segment 130 comprises at least one further DAC cell 155. For example, the at least one further DAC cell 155 may be a dummy cell, which is physically present in the third segment 150 for layout symmetry, but conventionally not used for signal processing. Alternatively, the at least one further DAC cell 155 may be purposely added to the third segment 150.

The digital processing circuit 130 illustrated in FIG. 8 is further configured to generate a second additional control word q2[Q2−1:0] of Q2 bits length for the third segment based on the multiplied third control word, and to supply the second additional control word q2[Q2−1:0] as input to the third segment 150.

The at least one further DAC cell 155 generates a second additional contribution 156 to the analog output signal 102 of DAC 800 based on the second additional control word q2[Q2−1:0].

Like for the second segment 120, the third segment 150 exhibits an extended range. Accordingly, the third segment 150 may account for, i.e. match, too big effective gains (amplitude) of the second contribution 121 provided by the second segment 120

That is, FIG. 8 illustrates a 3-segment DAC with analog overrange and associated digital pre-processing in each of the two lower segments. It is to be noted that the analog overrange in the second segment 120 can either be provided by one (or more) unary DAC cells (of size $2^L$) or by a number of (binary-scaled) DAC cells with analog weight smaller than the unary ISB-size $2^L$. The latter implementation may be advantageous in terms of the amount of generated out-of-band noise by the second segment 120. In the example of FIG. 8, two inter-segment gain error estimates ($e_{msb'}$ and $e_{isb'}$) are acquired.

Figure 9:
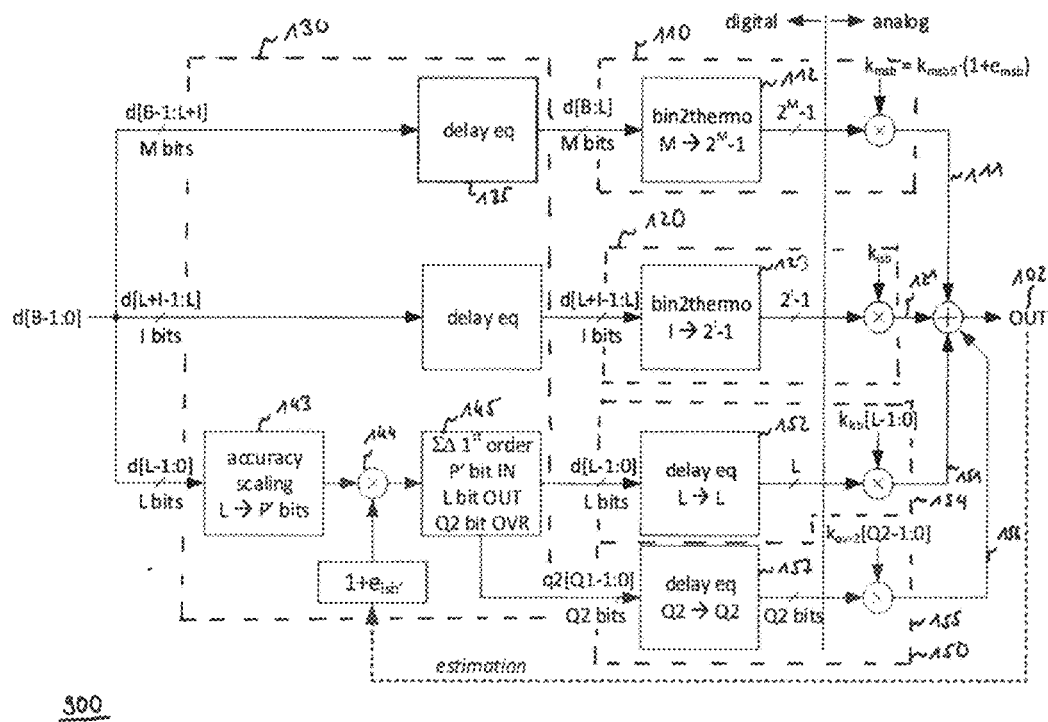

If the gain error between the upper two segments is small enough (e.g. due to (background) calibration) and only the inter-segment gain error between the second and the third segment is significant (e.g. due to different physical construction of the DAC cells in these two segments), inter-segment gain correction may be executed only between the second and the third segment. This is illustrated in FIG. 9 by means of DAC 900. DAC 900 is conceptually identical to DAC 500 illustrated in FIG. 5, since the first segment 110 and the second segment 120 of DAC 900 may be understood as two sub-segments of a M+I bit DAC segment.

Generally speaking, some examples of the present disclosure relate to a means for correcting gain mismatch between a first segment and a second segment of a DAC. While the first segment generates a first contribution to an output signal of the DAC based on a first number of bits of a digital input word for the DAC, the second segment generates a second contribution to the output signal based on a second number of bits of the digital input word. The means comprises a means for extending a numeric range of a second control word for the second segment by a predefined number of bits, the second control word being indicative of the second number of bits. Further, the means comprises a means for multiplying the second control word by a correction value that is based on information about the gain mismatch between the first segment and the second segment. Additionally, the means comprises a means for digitally filtering the multiplied second control word, and a means for reducing, after the digital filtering, the numeric range of the multiplied second control word by the predefined number of bits to generate a modified second control word for the second segment. The means further comprises a means for supplying the modified second control word as input to the second segment.

Figure 10:
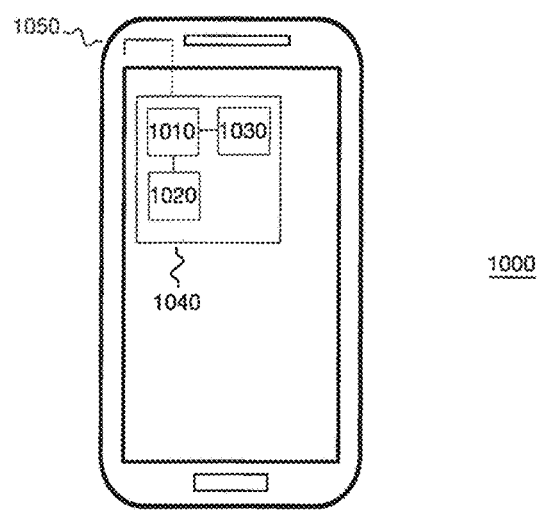
FIG. 10 illustrates an example of a mobile device comprising a DAC.

An example of an implementation using a DAC according to one or more aspects of the proposed architecture or one or more examples described above is illustrated in FIG. 10. FIG. 10 schematically illustrates an example of a mobile device 1000 (e.g. mobile phone, smartphone, tablet-computer, or laptop) comprising a DAC 1010 according to an example described herein. The DAC 1010 may allow to generate output signals with improved signal quality.

For example, a transmitter 1040 may comprise the DAC 1010. The DAC 1010 may, hence, allow to generate radio frequency transmit signals with improved noise characteristics. The radio frequency transmit signal may be radiated to the environment by the at least one antenna element 1050 coupled to the transmitter 1040.

As indicated above, the determination (estimation) of the information about the gain mismatch between segments of DAC 1010 may be done on-chip, i.e. by dedicated circuitry inside the transmitter 1040. The determination of the gain mismatch may, e.g., be done at start-up or in the background. For example, the transmitter 1040 may comprise a processing circuit 1020 configured to determine the information about the gain mismatch between a first segment and a second segment of DAC 1010 based on a measured weight of the analog output of at least one DAC cell of the first segment and the measured weight of the analog output of at least one DAC cell of the second segment (e.g. at start-up). Alternatively or additionally, the transmitter 1040 may comprising a processing circuit 1030 configured to determine the information about the gain mismatch between the first segment and the second segment based on an observed error in the analog output signal of DAC 1010 while the analog output signal comprises user data. The measurement of the DAC analog output signal, or some characteristic thereof, may be done using at least an Analog-to-Digital Converter (ADC). This ADC may either be added to the transmitter 1040 for the sole purpose of diagnosing the DAC output signal, or, more efficiently, an already existing ADC of transmitter 1040 may be reused for this purpose. Also, the ADC can either be located on-chip or off-chip, depending on the over-all system architecture and/or available resources.

The above wireless communication circuits using DACs and transmitters according to the proposed technique or one or more of the examples described above may be configured to operate according to one of the 3$^{rd}$ Generation Partnership Project (3GPP)-standardized mobile communication networks or systems. The mobile or wireless communication system may correspond to, for example, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM) or Enhanced Data rates for GSM Evolution (EDGE) network, a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

The proposed DAC is not limited to mobile devices. The DAC may be used in any electronic device requiring a high quality digital-to-analog signal conversion. For example, the electronic device may be related to wireline signal transmission. Accordingly, some examples of the present disclosure further relate to (cable) modems, routers, residential gateways, and wireless range extenders comprising a DAC or a transmitter according to the proposed technique or one or more of the examples described herein. The above electronic devices for wireline signal transmission using DACs and transmitters according to the proposed technique or one or more of the examples described above may be configured to operate according to one of the following standards/techniques: Asymmetric Digital Subscriber Line (ADSL), Very High Speed Digital Subscriber Line (VDSL), or G.fast (e.g. according to ITU-T standards G.9700 and G.9701 of the International Telecommunication Union, ITU).

Figure 11:
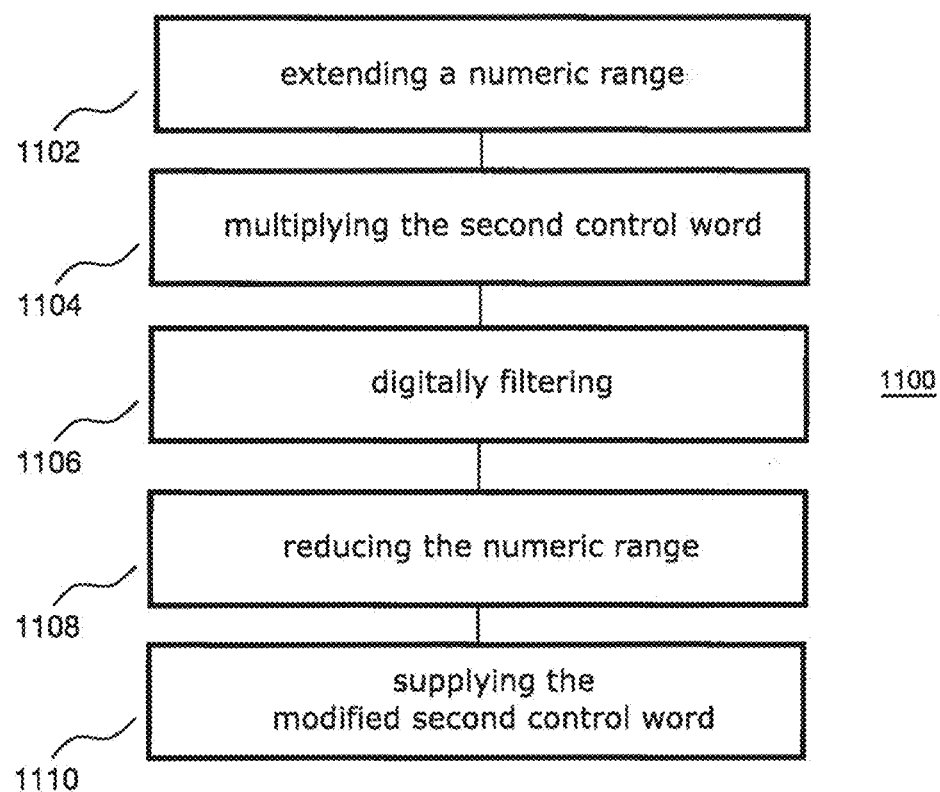
FIG. 11 illustrates a flowchart of an example of a method for correcting gain mismatch between a first segment and a second segment of a DAC.

An example of a method 1100 for correcting gain mismatch between a first segment and a second segment of a DAC is illustrated by means of a flowchart in FIG. 11. The first segment generates a first contribution to an analog output signal of the DAC based on a first number of bits of a digital input word for the DAC, wherein the second segment generates a second contribution to the analog output signal based on a second number of bits of the digital input word. The method 1100 comprises extending 1102 a numeric range of a second control word for the second segment by a predefined number of bits, wherein the second control word is indicative of the second number of bits. Further, the method 1100 comprises multiplying 1104 the second control word by a correction value that is based on information about a gain error of the first segment. The method 1100 additionally comprises digitally filtering 1106 the multiplied first control word. After the digital filtering, the method 1100 further comprises reducing 1108 the numeric range of the multiplied second control word by the predefined number of bits to generate a modified second control word for the second segment. Additionally, the method 1100 comprises supplying 1110 the modified second control word as input to the second segment.

More details and aspects of the method are mentioned in connection with the proposed technique or one or more examples described above (e.g. FIGS. 1-10). The method may comprise one or more additional optional features corresponding to one or more aspects of the proposed technique or one or more examples described above.

It is to be noted that the above described inter-segment gain error correction may be used together with intra-segment gain error correction methods (calibrations), which correct for mismatches between equal-sized (equal weighted) DAC cells within a segment of the DAC. For example, the above described inter-segment gain error correction may be used together with Dynamic-Element-Matching (DEM) schemes.

The examples as described herein may be summarized as follows:

Example 1 is a method for correcting gain mismatch between a first segment and a second segment of a digital-to-analog converter, wherein the first segment generates a first contribution to an analog output signal of the digital-to-analog converter based on a first number of bits of a digital input word for the digital-to-analog converter, and wherein the second segment generates a second contribution to the analog output signal based on a second number of bits of the digital input word, the method comprising: extending a numeric range of a second control word for the second segment by a predefined number of bits, the second control word being indicative of the second number of bits; multiplying the second control word by a correction value that is based on information about the gain mismatch between the first segment and the second segment; digitally filtering the multiplied second control word; after the digital filtering, reducing the numeric range of the multiplied second control word by the predefined number of bits to generate a modified second control word for the second segment; and supplying the modified second control word as input to the second segment.

In example 2, the correction value is 1+e in the method of example 1 with e indicating a relative difference between an effective gain of the first segment and a nominal gain of the first segment.

In example 3, the multiplied second control word is filtered using a nonlinear transfer function in the method of example 1 or example 2.

In example 4, the method of any of examples 1 to 3 further comprises: delaying a first control word for the first segment by a first delay time, wherein the first control word is indicative of the first number of bits, and wherein the first delay time is based on a required processing time for at least one of extending the numeric range of the second control word for the second segment, multiplying the second control word by the correction value, digitally filtering the multiplied second control word, and reducing the numeric range of the multiplied second control word.

In example 5, the second segment in the method of any of examples 1 to 4 comprises a first sub-segment generating a first part of the second contribution to the analog output signal based on a first part of the modified second control word, and wherein the second segment comprises a second sub-segment generating a second part of the second contribution to the analog output signal based on a second part of the modified second control word.

In example 6, the second segment in the method of any of the preceding examples comprises a plurality of digital-to-analog converter cells generating the second contribution to the analog output signal based on the modified second control word, wherein the second segment comprises at least one further digital-to-analog converter cell, and wherein the method further comprises: generating an additional control word for the second segment based on the multiplied second control word; and supplying the additional control word as input to the second segment, wherein the at least one further digital-to-analog converter cell generates an additional contribution to the analog output signal based on the additional control word.

In example 7, the modified second control word is supplied as input to the second segment in the method of any of examples 1 to 5 if an effective gain of the first segment is smaller than a nominal gain of the first segment, and wherein, if the effective gain of the first segment is larger than the nominal gain, the method further comprises: extending a numeric range of a first control word for the first segment by a second predefined number of bits, the first control word being indicative of the first number of bits; multiplying the first control word by a second correction value that is based on information about the gain mismatch between the first segment and the second segment; digitally filtering the multiplied first control word; after the digital filtering, reducing the numeric range of the multiplied first control word by the second predefined number of bits to generate a modified first control word for the first segment; and supplying the modified first control word as input to the first segment.

In example 8, if the effective gain of the first segment is larger than the nominal gain, the method of example 7 further comprises: supplying the second control word as input to the second segment.

In example 9, if the effective gain of the first segment is larger than the nominal gain, the method of example 8 further comprises: delaying the second control word by a second delay time, wherein the second delay time is based on a required processing time for at least one of extending the numeric range of the first control word for the first segment, multiplying the first control word by the correction value, digitally filtering the multiplied first control word, and reducing the numeric range of the multiplied first control word.

In example 10, the digital-to-analog converter in the method of any of the preceding examples further comprises a third segment generating a third contribution to the analog output signal based on a third number of bits of the digital input word, and wherein the method further comprises: extending a numeric range of a third control word for the third segment by a third predefined number of bits, the third control word being indicative of the third number of bits; multiplying the third control word by a second correction value that is based on information about a gain mismatch between the second segment and the third segment; digitally filtering the multiplied third control word; after the digital filtering, reducing the numeric range of the multiplied third control word by the third predefined number of bits to generate a modified third control word for the third segment; and supplying the modified third control word as input to the third segment.

In example 11, the first segment in the method of any of the preceding examples comprises a first plurality of digital-to-analog converter cells each configured to provide a respective weighted analog output, and wherein the second segment comprises a second plurality of digital-to-analog converter cells each configured to provide a respective weighted analog output.

In example 12, the analog outputs of one of the first and the second plurality of digital-to-analog converter cells are unary weighted in the method of example 11, wherein the analog outputs of the other one of the first and the second plurality of digital-to-analog converter cells are binary weighted.

In example 13, the information about the gain mismatch between the first segment and the second segment in the method of example 11 or example 12 is based on a measured weight of the analog output of at least one digital-to-analog converter cell of the first segment and the measured weight of the analog output of at least one digital-to-analog converter cell of the second segment.

In example 14, the information about the gain mismatch between the first segment and the second segment in the method of example 11 or example 12 is based on an observed error in the analog output signal of the digital-to-analog converter, the analog output signal comprising user data.

Example 15 is a non-transitory machine readable medium having stored thereon a program having a program code for performing the method of any of examples 1 to 14, when the program is executed on a processor.

Example 16 is a program having a program code configured to perform the method of any of examples 1 to 14, when the program is executed on a processor.

Example 17 is a means for correcting gain mismatch between a first segment and a second segment of a digital-to-analog converter, wherein the first segment generates a first contribution to an output signal of the digital-to-analog converter based on a first number of bits of a digital input word for the digital-to-analog converter, and wherein the second segment generates a second contribution to the output signal based on a second number of bits of the digital input word, the means comprising: a means for extending a numeric range of a second control word for the second segment by a predefined number of bits, the second control word being indicative of the second number of bits; a means for multiplying the second control word by a correction value that is based on information about the gain mismatch between the first segment and the second segment; a means for digitally filtering the multiplied second control word; a means for reducing, after the digital filtering, the numeric range of the multiplied second control word by the predefined number of bits to generate a modified second control word for the second segment; and a means for supplying the modified second control word as input to the second segment.

In example 18, the first segment in the means of example 17 comprises a first plurality of digital-to-analog converter cells each configured to provide a respective weighted analog output, and wherein the second segment comprises a second plurality of digital-to-analog converter cells each configured to provide a respective weighted analog output.

Example 19 is a digital-to-analog converter providing an analog output signal based on a digital input word, comprising a first segment configured to generate a first contribution to the analog output signal based on a first number of bits of the digital input word, a second segment configured to generate a second contribution to the output signal based on a second number of bits of the digital input word, and a digital processing circuit configured to: extend a numeric range of a second control word for the second segment by a predefined number of bits, the second control word being indicative of the second number of bits; multiply the second control word by a correction value that is based on information about the gain mismatch between the first segment and the second segment; digitally filter the multiplied second control word; after the digital filtering, reduce the numeric range of the multiplied second control word by the predefined number of bits to generate a modified second control word for the second segment; and supply the modified second control word as input to the second segment.

In example 20, the correction value is 1+e in the digital-to-analog converter of example 19 with e indicating a relative difference between an effective gain of the first segment and a nominal gain of the first segment.

In example 21, the digital processing circuit in the digital-to-analog converter of example 19 or example 20 is configured to digitally filter the multiplied second control word using a nonlinear transfer function.

In example 22, the digital processing circuit in the digital-to-analog converter of any of examples 19 to 21 is further configured to delay a first control word for the first segment by a first delay time, wherein the first control word is indicative of the first number of bits, and wherein the first delay time is based on a processing time required by the digital processing circuit for at least one of extending the numeric range of the second control word for the second segment, multiplying the second control word by the correction value, digitally filtering the multiplied second control word, and reducing the numeric range of the multiplied second control word.

In example 23, the second segment in the digital-to-analog converter of any of examples 19 to 22 comprises: a first sub-segment configured to generate a first part of the second contribution to the analog output signal based on a first part of the modified second control word; and a second sub-segment generating a second part of the second contribution to the analog output signal based on a second part of the modified second control word.

In example 24, the second segment in the digital-to-analog converter of any of examples 19 to 23 comprises a plurality of digital-to-analog converter cells configured to generate the second contribution to the analog output signal based on the modified second control word, wherein the second segment comprises at least one further digital-to-analog converter cell, and wherein the digital processing circuit is further configured to: generate an additional control word for the second segment based on the multiplied second control word; and supply the additional control word as input to the second segment, wherein the at least one further digital-to-analog converter cell is configured to generate an additional contribution to the analog output signal based on the additional control word.

In example 25, the processing circuit in the digital-to-analog converter of any of examples 19 to 23 is further configured to: extend a numeric range of a first control word for the first segment by a second predefined number of bits, the first control word being indicative of the first number of bits; multiply the first control word by the correction value; digitally filter the multiplied first control word; after the digital filtering, reduce the numeric range of the multiplied first control word by the second predefined number of bits to generate a modified first control word for the first segment; if an effective gain of the first segment is smaller than a nominal gain of the first segment, supply the modified second control word as input to the second segment; and if the effective gain of the first segment is larger than the nominal gain, supply the modified first control word as input to the first segment.

In example 26, if the effective gain of the first segment is larger than the nominal gain, the processing circuit in the digital-to-analog converter of example 25 is further configured to supply the second control word as input to the second segment.

In example 27, if the effective gain of the first segment is larger than the nominal gain, the processing circuit in the digital-to-analog converter of example 26 is configured to delay the second control word by a second delay time, wherein the second delay time is based on a processing time required by the digital processing circuit for at least one of extending the numeric range of the first control word for the first segment, multiplying the first control word by the correction value, digitally filtering the multiplied first control word, and reducing the numeric range of the multiplied first control word.

In example 28, the digital-to-analog converter of any of examples 19 to 27 further comprises: a third segment configured to generate a third contribution to the analog output signal based on a third number of bits of the digital input word, wherein digital processing circuit is further configured to: extend a numeric range of a third control word for the third segment by a third predefined number of bits, the third control word being indicative of the third number of bits; multiply the third control word by a second correction value that is based on information about a gain mismatch between the second segment and the third segment; digitally filter the multiplied third control word; after the digital filtering, reduce the numeric range of the multiplied third control word by the third predefined number of bits to generate a modified third control word for the third segment; and supply the modified third control word as input to the third segment.

In example 29, the first segment in the digital-to-analog converter of any of examples 19 to 28 comprises a first plurality of digital-to-analog converter cells each configured to provide a respective weighted analog output, and wherein the second segment comprises a second plurality of digital-to-analog converter cells each configured to provide a respective weighted analog output.

In example 30, the analog outputs of one of the first and the second plurality of digital-to-analog converter cells are unary weighted in the digital-to-analog converter of example 29, wherein the analog outputs of the other of the first and the second plurality of digital-to-analog converter cells are binary weighted.

Example 31 is a transmitter comprising a digital-to-analog converter according to any of examples 19 to 30.

In example 32, the transmitter of example 31 further comprises a processing circuit configured to determine the information about the gain mismatch between the first segment and the second segment based on a measured weight of the analog output of at least one digital-to-analog converter cell of the first segment and the measured weight of the analog output of at least one digital-to-analog converter cell of the second segment.

In example 33, the transmitter of example 31 further comprises a processing circuit configured to determine the information about the gain mismatch between the first segment and the second segment based on an observed error in the analog output signal of the digital-to-analog converter, the analog output signal comprising user data.

Example 34 is a mobile device comprising a digital-to-analog converter according to any of examples 19 to 30, or a transmitter according to any of examples 31 to 33.

In example 35, the mobile device of example 34 further comprises at least one antenna coupled to the transmitter.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a (software) program having a program code for performing one or more of the above methods, when the program is executed on a processor. Steps, operations or processes of various above-described methods may be performed by programmed processors. Examples may also cover program storage devices such as digital data storage media, which are machine or processor readable and encode machine-executable or processor-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in machine readable medium and so executed by a processor, whether or not such processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A method for correcting gain mismatch between a first segment and a second segment of a digital-to-analog converter, wherein the first segment generates a first contribution to an analog output signal of the digital-to-analog converter based on a first number of bits of a digital input word for the digital-to-analog converter, and wherein the second segment generates a second contribution to the analog output signal based on a second number of bits of the digital input word, the method comprising:
    extending a numeric range of a second control word for the second segment by a predefined number of bits, the second control word being indicative of the second number of bits;
    multiplying the second control word by a correction value that is based on information about the gain mismatch between the first segment and the second segment;
    digitally filtering the multiplied second control word;
    after the digital filtering, reducing the numeric range of the multiplied second control word by the predefined number of bits to generate a modified second control word for the second segment; and
    supplying the modified second control word as input to the second segment.

2. The method of claim 1, wherein the correction value is 1+e with e indicating a relative difference between an effective gain of the first segment and a nominal gain of the first segment.

3. The method of claim 1, wherein the multiplied second control word is filtered using a nonlinear transfer function.

4. The method of claim 1, further comprising:
    delaying a first control word for the first segment by a first delay time, wherein the first control word is indicative of the first number of bits, and wherein the first delay time is based on a required processing time for at least one of extending the numeric range of the second control word for the second segment, multiplying the second control word by the correction value, digitally filtering the multiplied second control word, and reducing the numeric range of the multiplied second control word.

5. The method of claim 1, wherein the second segment comprises a first sub-segment generating a first part of the second contribution to the analog output signal based on a first part of the modified second control word, and wherein the second segment comprises a second sub-segment generating a second part of the second contribution to the analog output signal based on a second part of the modified second control word.

6. The method of claim 1, wherein the second segment comprises a plurality of digital-to-analog converter cells generating the second contribution to the analog output signal based on the modified second control word, wherein the second segment comprises at least one further digital-to-analog converter cell, and wherein the method further comprises:
    generating an additional control word for the second segment based on the multiplied second control word; and
    supplying the additional control word as input to the second segment, wherein the at least one further digital-to-analog converter cell generates an additional contribution to the analog output signal based on the additional control word.

7. The method of claim 1, wherein the modified second control word is supplied as input to the second segment if an effective gain of the first segment is smaller than a nominal gain of the first segment, and wherein, if the effective gain of the first segment is larger than the nominal gain, the method further comprises:
    extending a numeric range of a first control word for the first segment by a second predefined number of bits, the first control word being indicative of the first number of bits;
    multiplying the first control word by a second correction value that is based on information about the gain mismatch between the first segment and the second segment;
    digitally filtering the multiplied first control word;
    after the digital filtering, reducing the numeric range of the multiplied first control word by the second predefined number of bits to generate a modified first control word for the first segment; and
    supplying the modified first control word as input to the first segment.

8. The method of claim 7, wherein, if the effective gain of the first segment is larger than the nominal gain, the method further comprises:
    supplying the second control word as input to the second segment.

9. The method of claim 8, wherein, if the effective gain of the first segment is larger than the nominal gain, the method further comprises:
    delaying the second control word by a second delay time, wherein the second delay time is based on a required processing time for at least one of extending the numeric range of the first control word for the first segment, multiplying the first control word by the correction value, digitally filtering the multiplied first control word, and reducing the numeric range of the multiplied first control word.

10. The method of claim 1, wherein the digital-to-analog converter further comprises a third segment generating a third contribution to the analog output signal based on a third number of bits of the digital input word, and wherein the method further comprises:
    extending a numeric range of a third control word for the third segment by a third predefined number of bits, the third control word being indicative of the third number of bits;
    multiplying the third control word by a second correction value that is based on information about a gain mismatch between the second segment and the third segment;
    digitally filtering the multiplied third control word;

after the digital filtering, reducing the numeric range of the multiplied third control word by the third predefined number of bits to generate a modified third control word for the third segment; and supplying the modified third control word as input to the third segment.

11. The method of claim 1, wherein the first segment comprises a first plurality of digital-to-analog converter cells each configured to provide a respective weighted analog output, and wherein the second segment comprises a second plurality of digital-to-analog converter cells each configured to provide a respective weighted analog output.

12. The method of claim 11, wherein the analog outputs of one of the first and the second plurality of digital-to-analog converter cells are unary weighted, and wherein the analog outputs of the other one of the first and the second plurality of digital-to-analog converter cells are binary weighted.

13. The method of claim 11, wherein the information about the gain mismatch between the first segment and the second segment is based on a measured weight of the analog output of at least one digital-to-analog converter cell of the first segment and the measured weight of the analog output of at least one digital-to-analog converter cell of the second segment.

14. The method of claim 11, wherein the information about the gain mismatch between the first segment and the second segment is based on an observed error in the analog output signal of the digital-to-analog converter, the analog output signal comprising user data.

15. A non-transitory machine readable medium having stored thereon a program having a program code for performing the method of claim 1, when the program is executed on a processor.

16. A digital-to-analog converter providing an analog output signal based on a digital input word, comprising a first segment configured to generate a first contribution to the analog output signal based on a first number of bits of the digital input word, a second segment configured to generate a second contribution to the output signal based on a second number of bits of the digital input word, and a digital processing circuit configured to:

extend a numeric range of a second control word for the second segment by a predefined number of bits, the second control word being indicative of the second number of bits;

multiply the second control word by a correction value that is based on information about the gain mismatch between the first segment and the second segment;

digitally filter the multiplied second control word;

after the digital filtering, reduce the numeric range of the multiplied second control word by the predefined number of bits to generate a modified second control word for the second segment; and supply the modified second control word as input to the second segment.

17. The digital-to-analog converter of claim 16, wherein the correction value is 1+e with e indicating a relative difference between an effective gain of the first segment and a nominal gain of the first segment.

18. The digital-to-analog converter of claim 16, wherein the digital processing circuit is configured to digitally filter the multiplied second control word using a nonlinear transfer function.

19. The digital-to-analog converter of claim 16, wherein the digital processing circuit is further configured to delay a first control word for the first segment by a first delay time, wherein the first control word is indicative of the first number of bits, and wherein the first delay time is based on a processing time required by the digital processing circuit for at least one of extending the numeric range of the second control word for the second segment, multiplying the second control word by the correction value, digitally filtering the multiplied second control word, and reducing the numeric range of the multiplied second control word.

20. The digital-to-analog converter of claim 16, wherein the second segment comprises:

a first sub-segment configured to generate a first part of the second contribution to the analog output signal based on a first part of the modified second control word; and a second sub-segment generating a second part of the second contribution to the analog output signal based on a second part of the modified second control word.

21. The digital-to-analog converter of claim 16, wherein the second segment comprises a plurality of digital-to-analog converter cells configured to generate the second contribution to the analog output signal based on the modified second control word, wherein the second segment comprises at least one further digital-to-analog converter cell, and wherein the digital processing circuit is further configured to:

generate an additional control word for the second segment based on the multiplied second control word; and supply the additional control word as input to the second segment, wherein the at least one further digital-to-analog converter cell is configured to generate an additional contribution to the analog output signal based on the additional control word.

22. The digital-to-analog converter of claim 16, wherein the processing circuit is further configured to:

extend a numeric range of a first control word for the first segment by a second predefined number of bits, the first control word being indicative of the first number of bits;

multiply the first control word by the correction value;

digitally filter the multiplied first control word;

after the digital filtering, reduce the numeric range of the multiplied first control word by the second predefined number of bits to generate a modified first control word for the first segment;

if an effective gain of the first segment is smaller than a nominal gain of the first segment, supply the modified second control word as input to the second segment; and if the effective gain of the first segment is larger than the nominal gain, supply the modified first control word as input to the first segment.

23. The digital-to-analog converter of claim 22, wherein, if the effective gain of the first segment is larger than the nominal gain, the processing circuit is further configured to supply the second control word as input to the second segment.

24. The digital-to-analog converter of claim 23, wherein, if the effective gain of the first segment is larger than the nominal gain, the processing circuit is configured to delay the second control word by a second delay time, wherein the second delay time is based on a processing time required by the digital processing circuit for at least one of extending the numeric range of the first control word for the first segment, multiplying the first control word by the correction value, digitally filtering the multiplied first control word, and reducing the numeric range of the multiplied first control word.

25. The digital-to-analog converter of claim 16, further comprising:
- a third segment configured to generate a third contribution to the analog output signal based on a third number of bits of the digital input word,
- wherein digital processing circuit is further configured to:
- extend a numeric range of a third control word for the third segment by a third predefined number of bits, the third control word being indicative of the third number of bits;
- multiply the third control word by a second correction value that is based on information about a gain mismatch between the second segment and the third segment;
- digitally filter the multiplied third control word;
- after the digital filtering, reduce the numeric range of the multiplied third control word by the third predefined number of bits to generate a modified third control word for the third segment; and
- supply the modified third control word as input to the third segment.

\* \* \* \* \*